United States Patent
Wu et al.

(10) Patent No.: US 11,139,816 B2
(45) Date of Patent: Oct. 5, 2021

(54) CLOCK AND DATA RECOVERY CIRCUIT, MEMORY STORAGE DEVICE AND SIGNAL GENERATING METHOD

(71) Applicant: PHISON ELECTRONICS CORP., Miaoli (TW)

(72) Inventors: Jen-Chu Wu, New Taipei (TW); Po-Min Cheng, Taoyuan (TW); Wun-Jian Su, New Taipei (TW); Chia-Hui Yu, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/822,025

(22) Filed: Mar. 18, 2020

(65) Prior Publication Data

US 2021/0273642 A1 Sep. 2, 2021

(30) Foreign Application Priority Data

Feb. 27, 2020 (TW) ................. 109106447

(51) Int. Cl.
| | | |
|---|---|---|
| *H04L 7/00* | (2006.01) | |
| *H03L 7/08* | (2006.01) | |
| *H03L 7/085* | (2006.01) | |
| *G06F 1/10* | (2006.01) | |
| *G06F 1/08* | (2006.01) | |
| *H03L 7/107* | (2006.01) | |

(52) U.S. Cl.
CPC ............. *H03L 7/0807* (2013.01); *G06F 1/08* (2013.01); *G06F 1/10* (2013.01); *H03L 7/085* (2013.01); *H03L 7/107* (2013.01)

(58) Field of Classification Search
CPC ....... H03L 7/0807; H03L 7/085; H03L 7/107; G06F 1/08; G06F 1/10
USPC ................... 375/371, 354, 316, 219, 295
See application file for complete search history.

(56) References Cited

U.S. PATENT DOCUMENTS

| | | | |
|---|---|---|---|
| 8,687,738 B1* | 4/2014 | Lee .................... | H04L 7/033 375/326 |
| 2012/0213265 A1* | 8/2012 | Wu ..................... | H04L 1/205 375/226 |
| 2019/0130942 A1 | 5/2019 | Hormati et al. | |

OTHER PUBLICATIONS

"Office Action of Taiwan Counterpart Application", dated Oct. 6, 2020, p. 1-p. 9.

* cited by examiner

*Primary Examiner* — Zewdu A Kassa
(74) *Attorney, Agent, or Firm* — JCIPRNET

(57) ABSTRACT

A clock and data recovery circuit is disclosed. The clock and data recovery circuit includes a phase detection circuit, a first voting circuit, a low-pass filtering circuit and a phase interpolation circuit. The phase detection circuit is configured to receive a first signal and a clock signal and generate a phase signal. The first voting circuit is configured to charge at least one capacitance component according to the phase signal and generate a first voting signal according to a charging result. The low-pass filtering circuit is configured to generate a phase control signal according to the first voting signal. The phase interpolation circuit is configured to generate the clock signal according to the phase control signal.

30 Claims, 5 Drawing Sheets

CLOCK AND DATA RECOVERY CIRCUIT, MEMORY STORAGE DEVICE AND SIGNAL GENERATING METHOD

CROSS-REFERENCE TO RELATED APPLICATION

This application claims the priority benefit of Taiwan application serial no. 109106447, filed on Feb. 27, 2020. The entirety of the above-mentioned patent application is hereby incorporated by reference herein and made a part of this specification.

BACKGROUND

Technical Field

The disclosure relates to a signal processing technology, and in particular to a clock and data recovery circuit, a memory storage device and a signal generating method.

Description of Related Art

Digital cameras, mobile phones, and MP3 players have grown rapidly over the past few years, leading to a rapid increase in consumer demand for storage media. Since rewritable non-volatile memory module (for example, flash memory) has the characteristics of non-volatility for data, power saving, small size, and no mechanical structure, it is very suitable for being embedded in the various portable multimedia devices exemplified above.

FIG. 1A is a schematic diagram of a conventional clock and data recovery circuit. Referring to FIG. 1A, a conventional clock and data recovery circuit 10 includes a phase detector 11, a voting circuit 12 (also referred to as a digital voting circuit), a digital filter 13, and a phase interpolator 14. The phase detector 11 can receive a data signal DATA and a recovered clock signal CLK. The phase detector 11 can compare the phase of the data signal DATA with the phase of the recovered clock signal CLK and output a comparison result. The voting circuit 12 may calculate the number of times that the phases of the data signal DATA and the recovered clock signal CLK being ahead of and/or falling behind each other according to the output of the phase detector 11 and output the statistical result after reduction of speed. The digital filter 13 can instruct the phase interpolator 14 to adjust the phase of the recovered clock signal according to the statistical result after reduction of speed. In this manner, the recovered clock signal can be locked to the correct sampling point on the data signal DATA.

FIG. 1B is a schematic diagram of a digital voting circuit. Please refer to FIG. 1B. Taking the voting circuit 12 in FIG. 1A as an example, the signals Q0 to Q2 are sampled in multiple cycles of the clock signal CLK, and the results are accumulated through flip-flops FF0 to FF3 and logic components L1 and L2 to output a signal Q3 with accumulated information.

In high-speed serial transmission, the jitter tolerance of the clock and data recovery circuit 10 on the signal can be used to evaluate the data receiving capability of the receiving end, and the response time of the clock and data recovery circuit 10 directly affects the jitter tolerance. In high-speed applications, digital voting circuits (such as voting circuit 12) need to sample the data signal DATA for multiple cycles (as shown in FIG. 1B), such that the response time increases, which in turn causes the clock and data recovery circuit 10 to have reduced jitter tolerance on signal.

SUMMARY

The exemplary embodiment of the present disclosure provides a clock and data recovery circuit, a memory storage device, and a signal generating method, which can improve the working efficiency of the clock and data recovery circuit.

An exemplary embodiment of the present disclosure provides a clock and data recovery circuit, which includes a phase detection circuit, a first voting circuit, a low-pass filtering circuit, and a phase interpolation circuit. The phase detection circuit is configured for receiving a first signal and a clock signal and generating a phase signal. The first voting circuit is coupled to the phase detection circuit and configured to charge at least one capacitance component according to the phase signal and generate a first voting signal according to a charging result. The low-pass filtering circuit is coupled to the first voting circuit and configured to generate a phase control signal according to the first voting signal. The phase interpolation circuit is coupled to the phase detection circuit and the low-pass filtering circuit and configured to generate the clock signal according to the phase control signal.

An exemplary embodiment of the present disclosure further provides a memory storage device, which includes a connection interface unit, a rewritable non-volatile memory module, a memory control circuit unit and a clock and data recovery circuit. The connection interface unit is coupled to a host system. The memory control circuit unit is coupled to the connection interface unit and the rewritable non-volatile memory module. The clock and data recovery circuit is disposed on the connection interface unit, the rewritable non-volatile memory module or the memory control circuit unit, and the clock and data recovery circuit includes a first voting circuit. The clock and data recovery circuit is configured to receive a first signal and a clock signal and generate a phase signal. The clock and data recovery circuit is further configured to charge at least one capacitance component in the first voting circuit according to the phase signal and generate a first voting signal according to a charging result. The clock and data recovery circuit is further configured to generate a phase control signal according to the first voting signal. The clock and data recovery circuit is further configured to generate the clock signal according to the phase control signal.

The exemplary embodiment of the present disclosure further provides a signal generating method for a memory storage device. The signal generating method includes: receiving a first signal and a clock signal and generating a phase signal; charging at least one capacitance component according to the phase signal and generating a first voting signal according to a charging result; generating a phase control signal according to the first voting signal; and generating the clock signal according to the phase control signal.

Based on the above, after receiving the first signal and the clock signal and generating the phase signal, at least one capacitance component in the first voting circuit can be charged according to the phase signal. Based on the charging result, the first voting signal can be generated. Based on the first voting signal, a phase control signal may be generated and configured to generate the clock signal (i.e., recover the clock signal). In this manner, the working efficiency of the clock and data recovery circuit can be effectively improved.

In order to make the above-mentioned features and advantages of this disclosure more comprehensible, the following embodiments are described in detail with the accompanying drawings as follows.

DESCRIPTION OF THE EMBODIMENTS

A plurality of exemplary embodiments are presented below to explain the present disclosure, but the present disclosure is not limited to the illustrated exemplary embodiments. Also, the exemplary embodiments may be combined as appropriate. The term "coupling" used throughout the specification (including claims) of the present disclosure can refer to any direct or indirect means of connection. For example, if the first device is described as being coupled to the second device, it should be construed that the first device can be directly connected to the second device, or the first device can be connected to the second device indirectly through another device or some connection means. In addition, the term "signal" may refer to at least one current, voltage, charge, temperature, data, or any one or more signals.

Figure 1A:
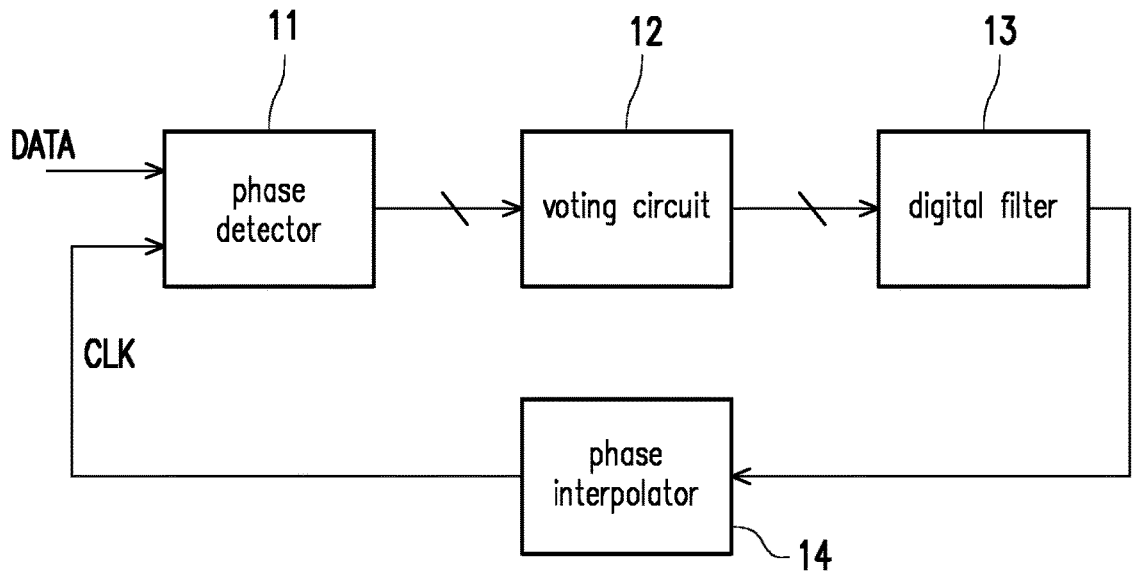
FIG. 1A is a schematic diagram of a conventional clock and data recovery circuit.
Figure 1B:
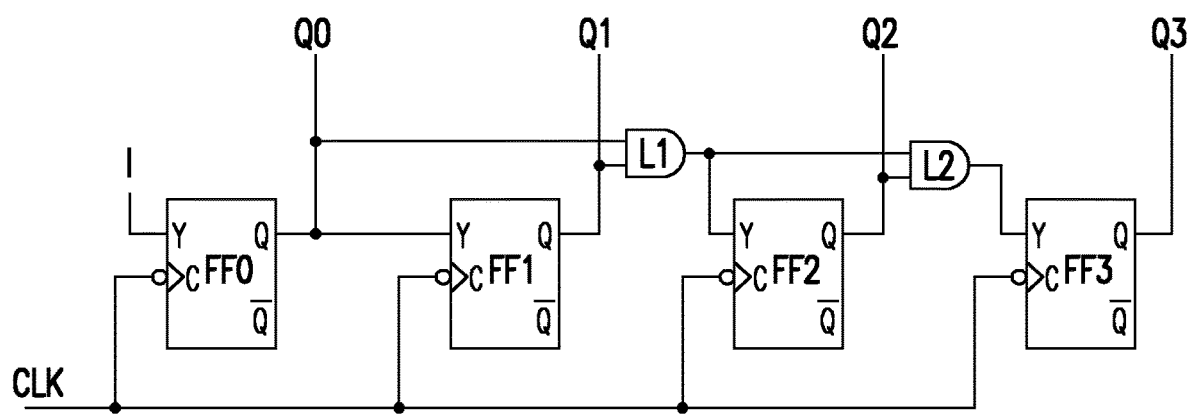
FIG. 1B is a schematic diagram of a digital voting circuit.
Figure 2:
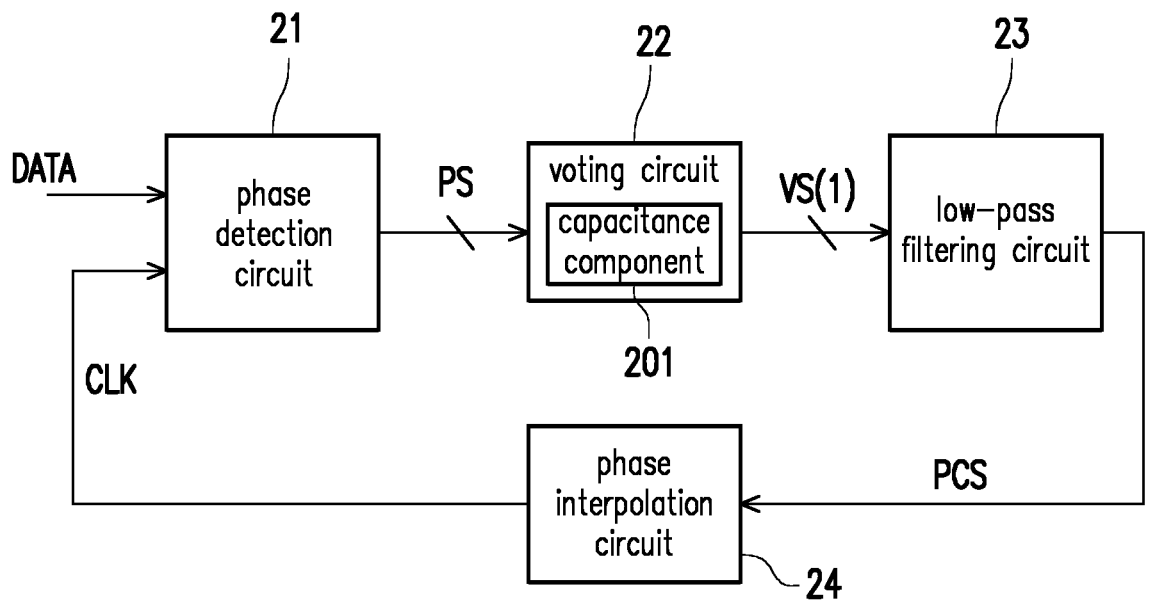
FIG. 2 is a schematic diagram of a clock and data recovery circuit according to an exemplary embodiment of the present disclosure.

FIG. 2 is a schematic diagram of a clock and data recovery circuit according to an exemplary embodiment of the present disclosure. Referring to FIG. 2, the clock and data recovery circuit 20 includes a phase detection circuit 21, a voting circuit (also referred to as a first voting circuit) 22, a low-pass filtering circuit 23, and a phase interpolation circuit 24. The phase detection circuit 21 can be configured to receive the signal DATA and the signal CLK. The phase detection circuit 21 can detect a relative phase relationship (such as a phase difference) between the signal DATA and the signal CLK and generate a signal PS. For example, the signal PS can be reflected at a certain time point, and the phase of the signal DATA is ahead of or falls behind the phase of the signal CLK.

In an exemplary embodiment, the signal DATA is also referred to as a first signal or a data signal. In an exemplary embodiment, the signal CLK is also referred to as a clock signal or a recovered clock signal. In an exemplary embodiment, the signal PS is also referred to as a phase signal.

The voting circuit 22 is coupled to the phase detection circuit 21 and the low-pass filtering circuit 23. The voting circuit 22 includes at least one capacitance component 201. The capacitance component 201 can be configured for charging and discharging. The voting circuit 22 can charge the capacitance component 201 according to the signal PS and generate a signal VS(1) according to the charging result of the capacitance component 201. In other words, the signal VS(1) can reflect the charging result of the capacitance component 201. In an exemplary embodiment, the signal VS(1) is also referred to as a first voting signal.

The low-pass filtering circuit 23 is coupled to the voting circuit 22 and the phase interpolation circuit 24. The low-pass filtering circuit 23 can generate a signal PCS according to the signal VS(1). For example, the signal PCS can be configured to instruct the phase interpolation circuit 24 to generate a signal CLK having a certain phase. In an exemplary embodiment, the signal PCS is also referred to as a phase control signal. The phase interpolation circuit 24 is coupled to the low-pass filtering circuit 23 and the phase detection circuit 21. The phase interpolation circuit 24 can generate a signal CLK according to the signal PCS.

In an exemplary embodiment, the signal PS includes signals UP and DN. The signal UP can reflect that the phase of the signal DATA is ahead of the phase of the signal CLK. The signal DN can reflect that the phase of the signal DATA falls behind the phase of the signal CLK. In an exemplary embodiment, the signal UP is also referred to as a first phase signal. In an exemplary embodiment, the signal DN is also referred to as a second phase signal.

In an exemplary embodiment, the number of the capacitance component 201 is at least two, one of which is also referred to as a first capacitance component, and another one of which is also referred to as a second capacitance component. In an exemplary embodiment, at least one of the first capacitance component and the second capacitance component can be charged according to the signal PS. In addition, the charging result may reflect a numerical relationship between a voltage (also referred to as a first voltage) of the first capacitance component and a voltage (also referred to as a second voltage) of the second capacitance component. For example, this numerical relationship may reflect that the first voltage is greater than, equal to, or less than the second voltage.

In an exemplary embodiment, the clock and data recovery circuit 20 can gradually keep the phase of the signal CLK to be synchronous with the phase of the signal DATA through the joint operation of the phase detection circuit 21, the voting circuit 22, the low-pass filtering circuit 23, and the phase interpolation circuit 24. When the phase of the signal DATA changes, the clock and data recovery circuit 20 can keep the phase of the signal CLK to be synchronous with the phase of the signal DATA again. In an exemplary embodiment, the operation of keeping the phase of the signal CLK to be synchronous with the phase of the signal DATA is also referred to as phase locking.

Figure 3:
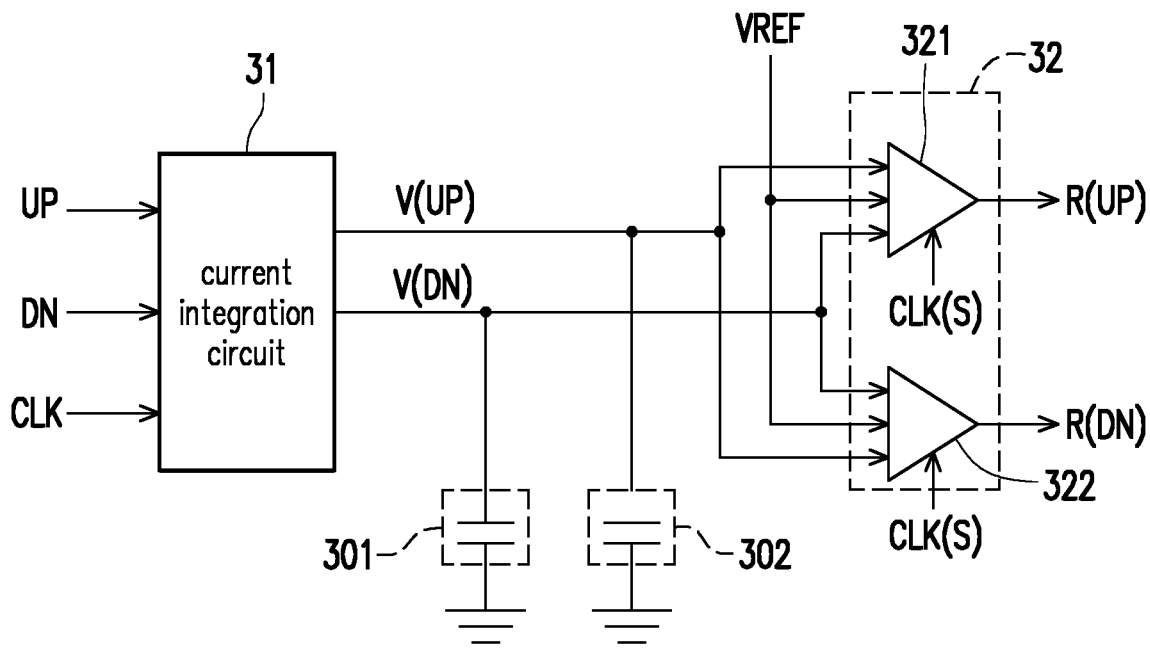
FIG. 3 is a schematic diagram of a voting circuit according to an exemplary embodiment of the present disclosure.

FIG. 3 is a schematic diagram of a voting circuit according to an exemplary embodiment of the present disclosure. Referring to FIG. 3, taking the voting circuit 22 of FIG. 2 as an example, the voting circuit 22 includes a current integration circuit 31, a capacitance component 301 (i.e., a first capacitance component), a capacitance component 302 (i.e., a second capacitance component), and a comparison circuit 32. The current integration circuit 31 can receive signals UP, DN, and CLK. The current integration circuit 31 can generate voltages V(UP) and V(DN) according to the signals UP, DN, and CLK. The signals UP and DN may be included in the signal PS in FIG. 2. In an exemplary embodiment, the voltage V(UP) is also referred to as a first charging voltage. In an exemplary embodiment, the voltage V(DN) is also referred to as a second charging voltage. The voltage V(UP) can be configured to charge the capacitance component 301. The voltage V(DN) can be configured to charge the capacitance component 302.

In an exemplary embodiment, the voltage V(UP) is generated according to the signal UP to reflect that the phase of the signal DATA is ahead of the phase of the signal CLK at a certain time point. In an exemplary embodiment, the voltage V(DN) is generated according to the signal DN to reflect that the phase of the signal DATA falls behind the phase of the signal CLK at a certain time point.

In an exemplary embodiment, the voltage (i.e., the first voltage) of the capacitance component 301 can reflect the number of times that the phase of the signal DATA is ahead of the phase of the signal CLK within a certain time range. In an exemplary embodiment, the voltage (i.e., the second voltage) of the capacitance component 302 can reflect the number of times that the phase of the signal DATA falls behind the phase of the signal CLK within a certain time range. For example, within a certain time range, if the phase of the signal DATA is ahead of the phase of the signal CLK more often than the phase of the signal DATA falls behind the phase of the signal CLK, the voltage (i.e., the first voltage) of the charged capacitance component 301 may be higher than the voltage (i.e., the second voltage) of the charged capacitance component 302. Alternatively, within a certain time range, if the phase of the signal DATA falls behind the phase of the signal CLK more often than the phase of the signal DATA is ahead of the phase of the signal CLK, the voltage (i.e., the first voltage) of the charged capacitance component 301 may be lower than the voltage (i.e., the second voltage) of the charged capacitance component 302.

The comparison circuit 32 is coupled to the capacitance components 301 and 302. The comparison circuit 32 can compare the voltage (that is, the first voltage) of the capacitance component 301 with the voltage (that is, the second voltage) of the capacitance component 302 and generate a signal VS(1) according to the numerical relationship between the first voltage and the second voltage. For example, the signal VS(1) may include the signals R(UP) and R(DN). The signal R(UP) can reflect a certain numerical relationship (also referred to as a first numerical relationship) between the first voltage and the second voltage. The signal R(DN) can reflect another numerical relationship (also referred to as a second numerical relationship) between the first voltage and the second voltage.

In an exemplary embodiment, the first numerical relationship is that the first voltage is higher than the second voltage, and the second numerical relationship is that the first voltage is lower than the second voltage. In an exemplary embodiment, if the voltage (i.e., the first voltage) of the charged capacitance component 301 is higher than the voltage (i.e., the second voltage) of the charged capacitance component 302, the comparison circuit 32 may output the signal R(UP) to reflect that, within a certain time range, the phase of the signal DATA is ahead of the phase of the signal CLK more often than the phase of the signal DATA falls behind the phase of the signal CLK. In an exemplary embodiment, if the voltage (i.e., the first voltage) of the charged capacitance component 301 is lower than the voltage (i.e., the second voltage) of the charged capacitance component 302, the comparison circuit 32 may output the signal R(DN) to reflect that, within a certain time range, the phase of the signal DATA falls behind the phase of the signal CLK more often than the phase of the signal DATA is ahead of the phase of the signal CLK. The low-pass filtering circuit 23 of FIG. 2 may generate a signal CS according to the signals R(UP) and/or R(DN) to adjust the phase and/or frequency of the signal CLK.

In an exemplary embodiment, the comparison circuit 32 includes comparison components 321 and 322. Both the comparison components 321 and 322 can be configured to compare the first voltage with the second voltage. In response to the first numerical relationship between the first voltage and the second voltage (for example, the first voltage is greater than the second voltage), the comparison component 321 may output the signal R(UP). In response to the second numerical relationship between the first voltage and the second voltage (for example, the first voltage is lower than the second voltage), the comparison component 322 can output the signal R(DN).

In an exemplary embodiment, both the comparison components 321 and 322 can further receive the voltage VREF. In an exemplary embodiment, the voltage VREF is also referred to as a reference voltage. In response to the voltage difference between the first voltage and the second voltage being greater than the reference voltage, the comparison component 321 may output the signal R(UP). In response to the voltage difference between the first voltage and the second voltage being not greater than the reference voltage, the comparison component 322 may output the signal R(DN). In an exemplary embodiment, at least one of the comparison components 321 and 322 is a sense amplifier. It should be noted that the present disclosure provides no limitation to the actual circuit structure of the comparison circuit 32, it will be suffice as long as the comparison circuit 32 can dynamically generate the signals R(UP) and/or R(DN) according to the numerical relationship between the first voltage and the second voltage.

In an exemplary embodiment, the comparison components 321 and 322 compare the first voltage with the second voltage in response to the signal CLK(S). For example, the comparison components 321 and 322 can both compare the first voltage with the second voltage in response to the rising edge (or falling edge) of the signal CLK(S) and output the signals R(UP) and/or R(DN). In an exemplary embodiment, the signal CLK(S) is also referred to as a sampling clock signal. In an exemplary embodiment, the signal CLK(S) can be obtained by delaying the signal CLK.

Figure 4:
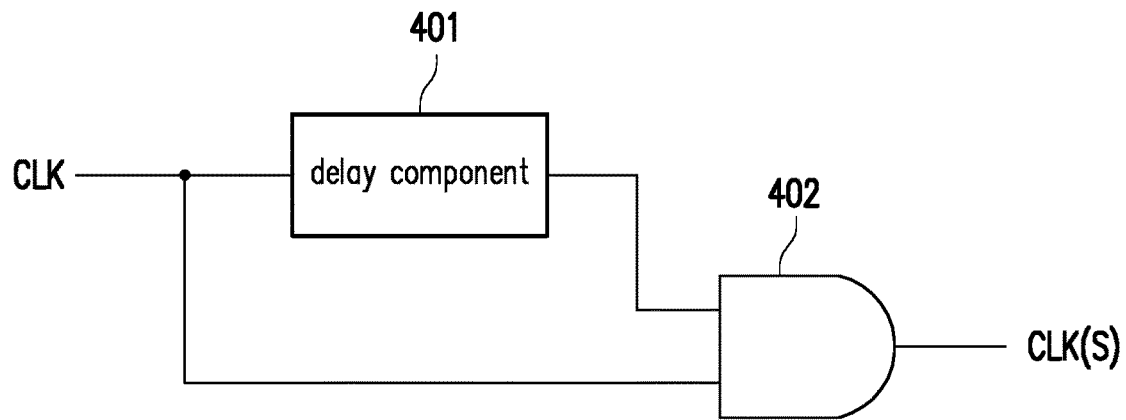
FIG. 4 is a schematic diagram of a sampling clock generating circuit according to an exemplary embodiment of the present disclosure.

FIG. 4 is a schematic diagram of a sampling clock generating circuit according to an exemplary embodiment of the present disclosure. Referring to FIG. 4, the sampling clock generating circuit 41 may be coupled to the comparison circuit 32 of FIG. 3 and configured to generate the signal CLK(S) according to the signal CLK. The sampling clock generating circuit 41 may include a delay component 401 and a logic component 402. For example, the delay component 401 may include at least one buffer unit, and the logic component 402 may include one AND gate. In an exemplary embodiment, the signal CLK may be delayed by the delay component 401 and pass through the logic component 402 to generate the signal CLK(S).

Figure 5:
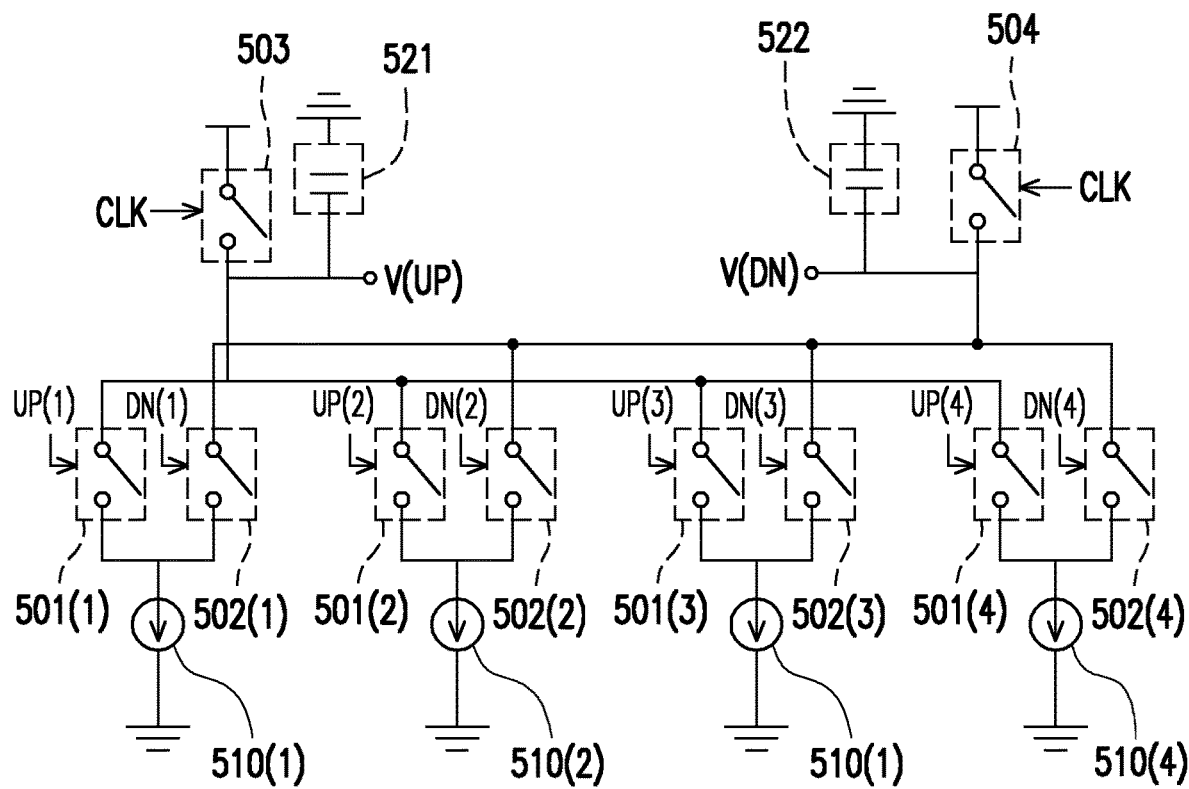
FIG. 5 is a schematic diagram of a current integration circuit according to an exemplary embodiment of the present disclosure.

FIG. 5 is a schematic diagram of a current integration circuit according to an exemplary embodiment of the present disclosure. Referring to FIG. 5, the current integration circuit 31 includes a current source 510(1) to 510(1), switches (also referred to as first switch) 501(1) to 501(4), switches (also referred to as second switch) 502(1) to 502(4), a switch (also referred to as a third switch) 503, and a switch (also referred to as a fourth switch) 504. In response to the rising edge (or falling edge) of the signal CLK, the switches 503 and 504 can be turned on simultaneously.

In an exemplary embodiment, the current integration circuit 31 includes signals UP(1) to UP(4), which can be generated through a delay signal UP with different phase angles and provided to the switches 501(1) to 501(4) respectively, thereby reflecting 4× sampling rate. For example, the signal UP(1) may be generated through a 45-degree delay signal UP, the signal UP(2) may be generated through a 90-degree delay signal UP, the signal UP(3) may be generated through a 135-degree delay signal UP, and the signal UP(4) may be generated through a 180-degree delay signal UP. Similarly, the signals DN(1) to DN(4) can be generated through a delay signal DN with different phase angles and provided to the switches 502(1) to 502(4) respectively to reflect 4× sampling rate. For example, the signal DN(1) may be generated through a 45-degree delay signal DN, the signal DN(2) may be generated through a 90-degree delay signal DN, the signal DN(3) may be generated through a 135-degree delay signal DN, and the signal DN(4) can be generated through a 180-degree delay signal DN. It should be noted that, in another exemplary embodiment, the total number of the first switch and the second switch may both be 2 or other values, so as to reflect 2× sampling rate or sampling rate in other multiples.

During the period when the switch 503 is turned on, the switches 501(1) to 501(4) can be turned on (or turned off) in response to the signals UP(1) to UP(4) and generate a voltage V(UP) to charge the capacitance component 301. The voltage (i.e., the first voltage) of the charged capacitance component 301 can reflect the number of times that the phase of the signal DATA in FIG. 2 is ahead of the phase of the signal CLK within a certain time range. Similarly, during the period when the switch 504 is turned on, the switches 502(1) to 502(4) can be turned on (or turned off) in response to the signals DN(1) to DN(4) and generate a voltage V(DN) to charge the capacitance component 302. The voltage (i.e., the second voltage) of the charged capacitance component 302 can reflect the number of times that the phase of the signal DATA in FIG. 2 falls behind the phase of the signal CLK within a certain time range.

It should be noted that in another exemplary embodiment of FIG. 5, the total number of the first switch and the second switch may be more or less depending on the frequency of the signal DATA. For example, in an exemplary embodiment, if the frequency of the signal DATA in FIG. 2 is higher, the total number of the first switch and the second switch in FIG. 5 may increase correspondingly.

In an exemplary embodiment, charging and discharging can be performed alternately through a plurality of voting circuits, and charging results can be output alternately by a multiplexer to further improve the working efficiency of the clock and data recovery circuit.

Figure 6:
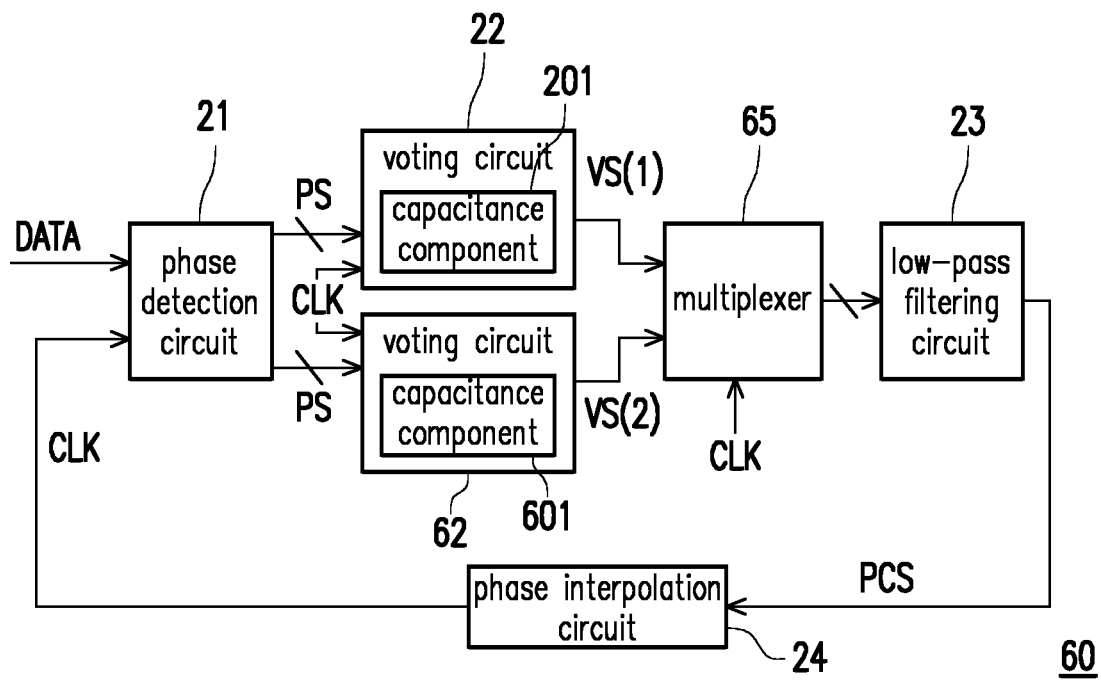
FIG. 6 is a schematic diagram of a clock and data recovery circuit according to an exemplary embodiment of the present disclosure.
Figure 7:
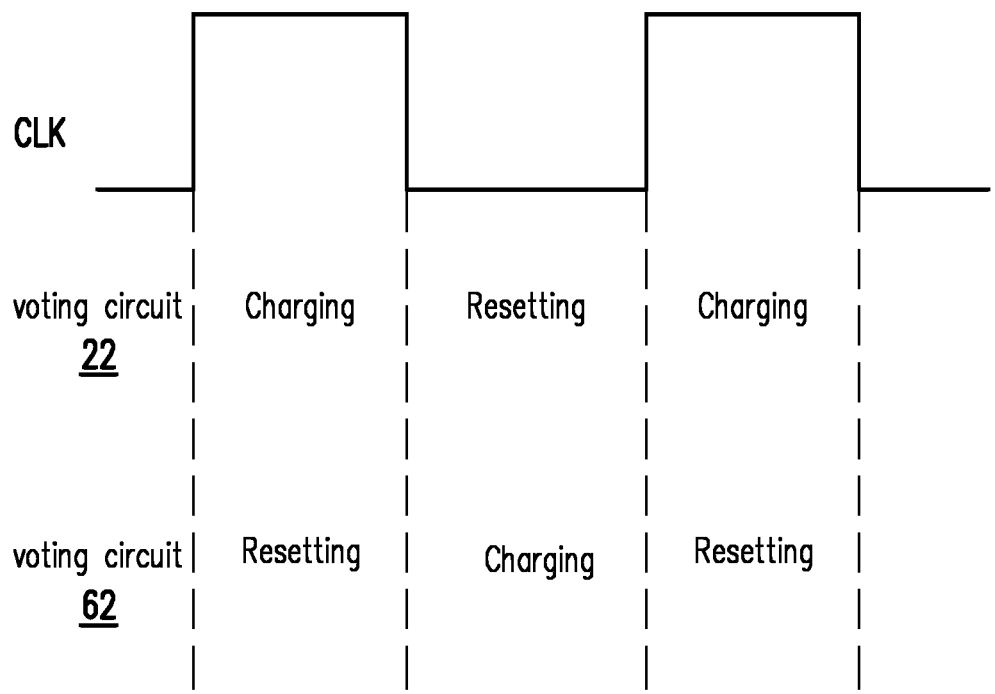
FIG. 7 is a timing diagram of a plurality of voting circuits working alternately according to an exemplary embodiment of the present disclosure.

FIG. 6 is a schematic diagram of a clock and data recovery circuit according to an exemplary embodiment of the present disclosure. FIG. 7 is a timing diagram of a plurality of voting circuits working alternately according to an exemplary embodiment of the present disclosure. Referring to FIG. 6, compared to the clock and data recovery circuit 20 in FIG. 2, in this exemplary embodiment, the clock and data recovery circuit 60 further includes a voting circuit (also referred to as a second voting circuit) 62 and a multiplexer 65. The voting circuit 22 and the voting circuit 62 may be coupled in parallel between the phase detection circuit 21 and the multiplexer 65.

Similar to the voting circuit 22, the voting circuit 62 can charge the capacitance component 601 according to the signal PS and generate a signal (also referred to as a second voting signal) VS(2) according to the charging result of the capacitance component 601. In other words, the signal VS(2) can reflect the charging result of the capacitance component 601. It should be noted that the circuit structure and/or operating principle of the voting circuit 62 may be identical with or similar to the circuit structure and/or operating principle of the voting circuit 22, and related details are not repeated herein. The multiplexer 65 can selectively provide at least one of the signals VS(1) and VS(2) to the low-pass filtering circuit 23 according to the clock signal CLK.

Referring to FIG. 7, according to the clock signal CLK, the voting circuits 22 and 62 can work alternately. For example, the voting circuit 22 may be triggered by the rising edge of the clock signal CLK to start charging the capacitance component 201 and generate a signal VS(1). In response to the rising edge of the clock signal CLK, the multiplexer 65 can provide the signal VS(1) to the low-pass filtering circuit 23. While the voting circuit 22 is charging the capacitance component 201, the voting circuit 62 may be reset. For example, during the reset of the voting circuit 62, the capacitance component 601 may be discharged.

On the other hand, the voting circuit 62 may be triggered by the falling edge of the clock signal CLK to start charging the capacitance component 601 and generate a signal VS(2). In response to the falling edge of the clock signal CLK, the multiplexer 65 can provide the signal VS(2) to the low-pass filtering circuit 23. While the voting circuit 62 is charging the capacitance component 601, the voting circuit 22 may be reset. For example, during reset of the voting circuit 22, the capacitance component 201 may be discharged. By operating the voting circuit 22 and the voting circuit 62 alternately, the overall working efficiency of the clock and data recovery circuit 60 can be improved.

In an exemplary embodiment, the clock and data recovery circuit 20 of FIG. 2 and/or the clock and data recovery circuit 60 of FIG. 6 may be disposed in a memory storage device. In another exemplary embodiment, the clock and data recovery circuit 20 of FIG. 2 and/or the clock and data recovery circuit 60 of FIG. 6 may also be disposed in other types of electronic devices, and is not limited to a memory storage device.

Figure 8:
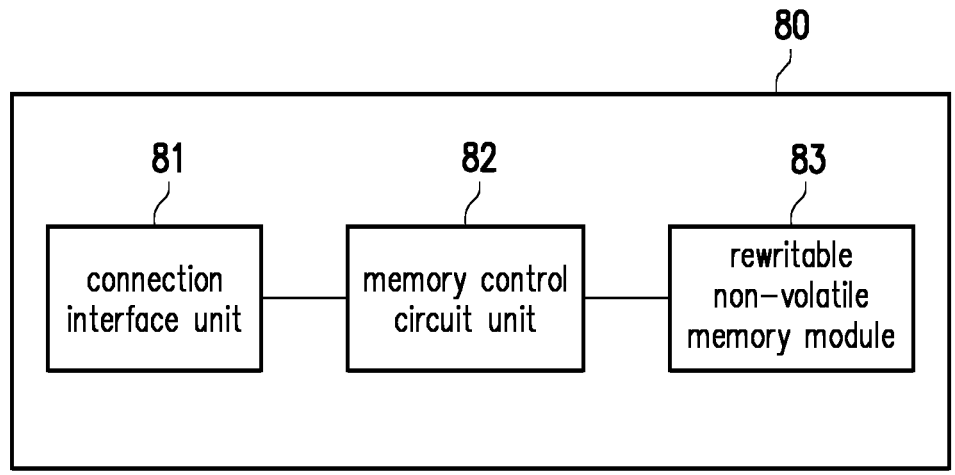
FIG. 8 is a schematic diagram of a memory storage device according to an exemplary embodiment of the present disclosure.

FIG. 8 is a schematic diagram of a memory storage device according to an exemplary embodiment of the present disclosure. Referring to FIG. 8, the memory storage device 80 is, for example, a memory storage device including a rewritable non-volatile memory module 83 such as a solid state drive (SSD). The memory storage device 80 can be used with a host system, and the host system can write data to the memory storage device 80 or read data from the memory storage device 80. For example, the host system mentioned above is any system that can substantially work with the memory storage device 80 to store data, such as a desktop computer, a notebook computer, a digital camera, a video camera, a communication device, an audio player, a video player or a tablet PC.

The memory storage device 80 includes a connection interface unit 81, a memory control circuit unit 82, and a rewritable non-volatile memory module 83. The connection interface unit 81 is configured to connect the memory storage device 80 to the host system. In an exemplary embodiment, the connection interface unit 81 is compatible with the Serial Advanced Technology Attachment (SATA) standard. However, it must be understood that the present disclosure is not limited thereto, and the connection interface unit 81 may also conform to the Parallel Advanced Technology Attachment (PATA) standard, the Peripheral Component Interconnect Express (PCI Express) standard, the Universal Serial Bus (USB) standard or other suitable standards. The connection interface unit 81 may be packaged in a chip with the memory control circuit unit 82, or the connection interface unit 81 may be disposed outside a chip including the memory control circuit unit 82.

The memory control circuit unit 82 is configured to perform data writing, reading, and erasing operations in the rewritable non-volatile memory module 83 according to instructions from the host system. In an exemplary embodiment, the memory control circuit unit 82 is also called a memory controller or a flash memory controller.

The rewritable non-volatile memory module 83 is coupled to the memory control circuit unit 82 and configured to store data written by the host system. The rewritable non-volatile memory module 83 can be a single level cell (SLC) NAND type flash memory module (that is, a flash memory cell module that can store 1 data bit in one memory cell), a multi level cell (MLC) NAND-type flash memory module (i.e., a flash memory cell module that can store 2 data bits in one memory cell), a triple level cell (TLC) NAND-type flash memory module (that is, a flash memory module that can store 3 data bits in one memory cell), a qual level cell (QLC) NAND type flash memory module (that is, a flash memory module that can store 4 data bits in one memory cell), other flash memory modules, or other memory modules with the same characteristics.

In an exemplary embodiment, the clock and data recovery circuit 20 of FIG. 2 and/or the clock and data recovery circuit 60 of FIG. 6 may be disposed in the connection interface unit 81, the memory control circuit unit 82, and/or the rewritable non-volatile memory module 83.

It should be noted that the electronic circuit structure shown in FIG. 2 to FIG. 6 is only a schematic diagram of a clock and data recovery circuit in some exemplary embodiments, and is not intended to limit the present disclosure. In some applications not mentioned, more electronic components can be added to the clock and data recovery circuit or replace some electronic components to provide additional, identical or similar functions. In addition, in some applications not mentioned, the circuit layout and/or component coupling relationship within the clock and data recovery circuit can also be changed as appropriate to meet the actual needs.

Figure 9:
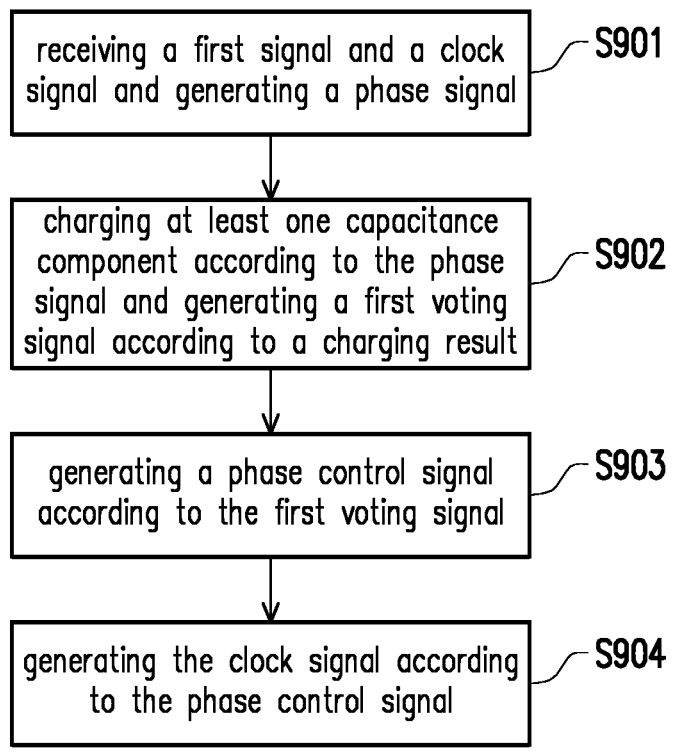
FIG. 9 is a flowchart of a signal generating method according to an exemplary embodiment of the present disclosure.

FIG. 9 is a flowchart of a signal generating method according to an exemplary embodiment of the present disclosure. Please refer to FIG. 9. In step S901, a first signal and a clock signal are received and a phase signal is generated. In step S902, the at least one capacitance component is charged according to the phase signal and a first voting signal is generated according to the charging result. In step S903, a phase control signal is generated according to the first voting signal. In step S904, the clock signal is generated according to the phase control signal.

However, the steps in FIG. 9 have been described above in detail, and will not be repeated here. It should be noted that each step in FIG. 9 can be implemented as multiple program codes or circuits, the present disclosure provides no limitation thereto. In addition, the method in FIG. 9 can be used in combination with the above exemplary embodiments, or can be used alone, the present disclosure provides no limitation thereto.

In summary, in the exemplary embodiment of the present disclosure, the clock and data recovery circuit can charge the capacitance component in the analog voting circuit according to the information concerning phases of multiple signals being ahead of and/or falling behind each other. According to the charging result, the clock and data recovery circuit can adjust the frequency and/or phase of the clock signal to achieve the purpose of phase locking. Compared with the conventional digital voting circuit, the clock and data recovery circuit provided by the exemplary embodiment of the present disclosure can have a shorter response time, thereby improving the overall working efficiency of the clock data recovery circuit.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A clock and data recovery circuit, comprising:
   a phase detection circuit configured to receive a first signal and a clock signal and generating a phase signal;
   a first voting circuit coupled to the phase detection circuit and configured to charge at least one capacitance component according to the phase signal and generate a first voting signal according to a charging result;
   a low-pass filtering circuit coupled to the first voting circuit and configured to generate a phase control signal according to the first voting signal; and
   a phase interpolation circuit coupled to the phase detection circuit and the low-pass filtering circuit and configured to generate the clock signal according to the phase control signal.

2. The clock and data recovery circuit according to claim 1, wherein the phase signal comprises a first phase signal and a second phase signal, and the first phase signal reflects that a phase of the first signal is ahead of a phase of the clock signal, and the second phase signal reflects that the phase of the first signal falls behind the phase of the clock signal.

3. The clock and data recovery circuit according to claim 1, wherein the at least one capacitance component comprises a first capacitance component and a second capacitance component, and at least one of the first capacitance component and the second capacitance component is charged according to the phase signal, and the charging result reflects a numerical relationship between a first voltage of the first capacitance component and a second voltage of the second capacitance component.

4. The clock and data recovery circuit according to claim 3, wherein the first voting circuit comprises:
   a current integration circuit coupled to the phase detection circuit and configured to generate a first charging voltage and a second charging voltage according to the phase signal, wherein the first charging voltage is configured to charge the first capacitance component, and the second charging voltage is configured to charge the second capacitance component.

5. The clock and data recovery circuit according to claim 4, wherein the current integration circuit comprises:

at least one first switch coupled to at least one current source and configured to be turned on in response to a first phase signal in the phase signal and generate the first charging voltage; and at least one second switch coupled to the at least one current source and configured to be turned on in response to a second phase signal in the phase signal and generate the second charging voltage.

6. The clock and data recovery circuit according to claim 3, wherein the first voting circuit comprises:

a comparison circuit configured to compare the first voltage with the second voltage and generate the first voting signal according to the numerical relationship.

7. The clock and data recovery circuit according to claim 6, wherein the first voting circuit further comprises:

a sampling clock generating circuit coupled to the comparison circuit and generating a sampling clock signal according to the clock signal; and the comparison circuit comparing the first voltage with the second voltage in response to the sampling clock signal.

8. The clock and data recovery circuit according to claim 1, further comprising:

a second voting circuit coupled to the phase detection circuit and generating a second voting signal according to the phase signal; and a multiplexer coupled to the second voting circuit and the low-pass filtering circuit, wherein the multiplexer is configured to provide at least one of the first voting signal and the second voting signal to the low-pass filtering circuit.

9. The clock and data recovery circuit according to claim 8, wherein the first voting circuit is triggered by a rising edge of the clock signal to generate the first voting signal, and the second voting circuit is triggered by a falling edge of the clock signal to generate the second voting signal.

10. The clock and data recovery circuit according to claim 8, wherein the second voting circuit is reset while the first voting circuit is charging the at least one capacitance component.

11. A memory storage device, comprising:

a connection interface unit configured to be coupled to a host system;

a rewritable non-volatile memory module;

a memory control circuit unit coupled to the connection interface unit and the rewritable non-volatile memory module; and a clock and data recovery circuit disposed in the connection interface unit, the rewritable non-volatile memory module or the memory control circuit unit, and the clock and data recovery circuit comprising a first voting circuit, wherein clock and data recovery circuit is configured to receive a first signal and a clock signal and generate a phase signal, the clock and data recovery circuit is further configured to charge at least one capacitance component in the first voting circuit according to the phase signal and generate a first voting signal according to a charging result, the clock and data recovery circuit is further configured to generate a phase control signal according to the first voting signal, and the clock and data recovery circuit is further configured to generate the clock signal according to the phase control signal.

12. The memory storage device according to claim 11, wherein the phase signal comprises a first phase signal and a second phase signal, and the first phase signal reflects that a phase of the first signal is ahead of a phase of the clock signal, and the second phase signal reflects that the phase of the first signal falls behind the phase of the clock signal.

13. The memory storage device according to claim 11, wherein the at least one capacitance component comprises a first capacitance component and a second capacitance component, at least one of the first capacitance component and the second capacitance component is charged according to the phase signal, and the charging result reflects a numerical relationship between a first voltage of the first capacitance component and a second voltage of the second capacitance component.

14. The memory storage device according to claim 13, wherein the clock and data recovery circuit comprises:

a current integration circuit configured to generate a first charging voltage and a second charging voltage according to the phase signal, wherein the first charging voltage is configured to charge the first capacitance component, and the second charging voltage is configured to charge the second capacitance component.

15. The memory storage device according to claim 14, wherein the current integration circuit comprises:

at least one first switch coupled to at least one current source and configured to be turned on in response to a first phase signal in the phase signal and generate the first charging voltage; and at least one second switch coupled to the at least one current source and configured to be turned on in response to a second phase signal in the phase signal and generate the second charging voltage.

16. The memory storage device according to claim 13, wherein the first voting circuit is configured to compare the first voltage with the second voltage and generate the first voting signal according to the numerical relationship.

17. The memory storage device according to claim 16, wherein the first voting circuit is further configured to generate a sampling clock signal according to the clock signal, and the first voting circuit is further configured to compare the first voltage with the second voltage in response to the sampling clock signal.

18. The memory storage device according to claim 11, wherein the clock and data recovery circuit further comprises a second voting circuit, the second voting circuit is configured to generate a second voting signal according to the phase signal, and the second voting circuit is further configured to provide at least one of the first voting signal and the second voting signal to a low-pass filtering circuit through a multiplexer.

19. The memory storage device according to claim 18, wherein the first voting circuit is triggered by a rising edge of the clock signal to generate the first voting signal, and the second voting circuit is triggered by a falling edge of the clock signal to generate the second voting signal.

20. The memory storage device according to claim 18, wherein the second voting circuit is reset while the first voting circuit is charging the at least one capacitance component.

21. A signal generating method for a memory storage device, and the signal generating method comprising:

receiving a first signal and a clock signal and generating a phase signal;

charging at least one capacitance component according to the phase signal and generating a first voting signal according to a charging result;

generating a phase control signal according to the first voting signal; and generating the clock signal according to the phase control signal.

22. The signal generating method according to claim 21, wherein the phase signal comprises a first phase signal and a second phase signal, and the first phase signal reflects that a phase of the first signal is ahead of a phase of the clock signal, and the second phase signal reflects that the phase of the first signal falls behind the phase of the clock signal.

23. The signal generating method according to claim 21, wherein the at least one capacitance component comprises a first capacitance component and a second capacitance component, and the step of charging the at least one capacitance component according to the phase signal comprises:

charging at least one of the first capacitance component and the second capacitance component according to the phase signal, wherein the charging result reflects a numerical relationship between a first voltage of the first capacitance component and a second voltage of the second capacitance component.

24. The signal generating method according to claim 23, the step of charging the at least one of the first capacitance component and the second capacitance component according to the phase signal comprises:

generating a first charging voltage and a second charging voltage according to the phase signal;

charging the first capacitance component by using the first charging voltage; and charging the second capacitance component by using the second charging voltage.

25. The signal generating method according to claim 24, wherein the step of generating the first charging voltage and the second charging voltage according to the phase signal comprises:

turning on at least one first switch in response to a first phase signal in the phase signal to generate the first charging voltage, wherein the at least one first switch is coupled to at least one current source; and turning on at least one second switch in response to a second phase signal in the phase signal to generate the second charging voltage, wherein the at least one second switch is coupled to the at least one current source.

26. The signal generating method according to claim 23, wherein the step of generating the first voting signal according to the charging result comprises:

comparing the first voltage with the second voltage and generating the first voting signal according to the numerical relationship.

27. The signal generating method according to claim 26, further comprising:

generating a sampling clock signal according to the clock signal; and comparing the first voltage with the second voltage in response to the sampling clock signal.

28. The signal generating method according to claim 21, further comprising:

generating a second voting signal according to the phase signal; and generating the phase control signal according to the second voting signal.

29. The signal generating method according to claim 28, further comprising:

generating the first voting signal in response to a rising edge of the clock signal; and generating the second voting signal in response to a falling edge of the clock signal.

30. The signal generating method according to claim 28, further comprising:

resetting a second voting circuit configured to generate the second voting signal while charging the at least one capacitance component.

* * * * *